United States Patent
Kwon

(10) Patent No.: US 11,618,948 B2
(45) Date of Patent: Apr. 4, 2023

(54) METHOD OF FORMING COATING LAYER OF WHICH COMPOSITION CAN BE CONTROLLED

(71) Applicant: Soon Young Kwon, Cheonan-si (KR)

(72) Inventor: Soon Young Kwon, Cheonan-si (KR)

(*) Notice: Subject to any disclaimer, the term of this patent is extended or adjusted under 35 U.S.C. 154(b) by 0 days.

(21) Appl. No.: 17/726,729

(22) Filed: Apr. 22, 2022

(65) Prior Publication Data
US 2022/0349055 A1 Nov. 3, 2022

(30) Foreign Application Priority Data
Apr. 28, 2021 (KR) .................. 10-2021-0054943

(51) Int. Cl.
| | | |
|---|---|---|
| *C23C 16/52* | (2006.01) | |
| *C23C 16/448* | (2006.01) | |
| *C23C 16/505* | (2006.01) | |
| *C23C 16/40* | (2006.01) | |

(52) U.S. Cl.
CPC ........ *C23C 16/4488* (2013.01); *C23C 16/405* (2013.01); *C23C 16/505* (2013.01); *C23C 16/52* (2013.01)

(58) Field of Classification Search
CPC ..... C23C 16/405; C23C 16/505; C23C 16/52; C23C 16/4488; C23C 14/548; C23C 14/30; C23C 14/221; C23C 14/0694; C23C 14/0031
See application file for complete search history.

(56) References Cited

U.S. PATENT DOCUMENTS

| | | | |
|---|---|---|---|
| 2019/0185989 A1* | 6/2019 | McFadden | C23C 14/221 |
| 2020/0095687 A1* | 3/2020 | Park | C23C 24/06 |
| 2021/0292893 A1* | 9/2021 | Mitrovic | C25D 11/026 |

FOREIGN PATENT DOCUMENTS

| | | |
|---|---|---|
| KR | 10-2009-0045382 A | 5/2009 |
| KR | 10-1183021 B1 | 9/2012 |
| KR | 10-2014-0098176 A | 8/2014 |
| KR | 10-2019-0022054 A | 3/2019 |
| KR | 10-2019-0082119 A | 7/2019 |
| KR | 10-2107446 B1 | 5/2020 |
| WO | WO-2019132550 A1 * | 7/2019 ......... H01L 21/0226 |

* cited by examiner

*Primary Examiner* — Hai Y Zhang
(74) *Attorney, Agent, or Firm* — KORUS Patent, LLC; Seong Il Jeong

(57) ABSTRACT

The present invention relates to a method of forming a coating layer of which a composition can be controlled, the method comprising steps of: preparing a substrate inside a chamber; evaporating a deposition material to generate $YF_3$ or YOF particles in a gas phase by irradiating an electron beam on a $YF_3$ deposition material provided in a solid form in an electron beam source; generating radical particles having activation energy by injecting a process gas containing oxygen into a RF energy beam source; irradiating an RF energy beam including oxygen radical particles toward the substrate; controlling a composition of a thin film by generating YOF deposition particles having a modified atomic ratio by adjusting an amount of fluorine substitution by oxygen as the $YF_3$ or YOF particles and the oxygen radical particles react, and depositing the YOF deposition particles on the substrate with the RF energy beam.

8 Claims, 8 Drawing Sheets

METHOD OF FORMING COATING LAYER OF WHICH COMPOSITION CAN BE CONTROLLED

FIELD OF THE INVENTION

The present invention relates to a method of forming a coating layer of which a composition can be controlled, and more particularly, to a method of forming a coating layer of which a composition can be controlled, which allows producing a YOF coating layer having various atomic ratios by controlling an ion current density of a RF energy beam source and thus controlling an amount of fluorine substitution by oxygen, when depositing the YOF coating layer on a substrate, which is formed by reaction of $YF_3$ particles evaporated in an electron beam source and oxygen radicals generated in the high-density RF energy beam source.

BACKGROUND OF THE INVENTION

A ceramic material having a high melting point and excellent durability is applied to members used in a plasma environment of semiconductor device and display processes, such as a dielectric window, a shower head, an electrostatic chuck, a heater, a chamber liner, and a boat, a focus ring, and a wall liner for a chemical vapor deposition (CVD). However, according to demand for high integration of a semiconductor device, density of plasma used in semiconductor manufacturing facilities is increasing, and thus, there is an emerging need for development of a ceramic material with excellent plasma etch resistance and less pollutant particles.

Quartz ($SiO_2$) or alumina ($Al_2O_3$) is mainly used as a conventional ceramic material, but there are limitations in that it has process defects caused by particle fall-out and a short lifespan caused by low plasma resistance.

Recently, yttrium oxide ($Y_2O_3$), also referred to as 'Yttria,' or rare earth ceramic materials, which has excellent etch resistance, have been used. Based on factors such as production convenience and high price, yttrium oxide or a rare earth based material is coated on a quartz or alumina substrate and used as a plasma resistant member.

As a conventional method of forming a coating film, a plasma spraying method, which forms a coating film by spraying of powder using high-temperature plasma, has been used. However, the ceramic coating film formed by this method has a high porosity and a rough surface due to a unique multilayer microstructure formed by the spraying method. Accordingly, the lifespan of the coating layer is shortened in that the high porosity allows reactive gases generated in plasma environment to penetrate into the ceramic coating film through pores and to promote reaction, and the rough surface allows selective etching by particles accelerated in the plasma.

Meanwhile, Korean Patent Registration No. 10-1183021 (Patent Document 1) discloses a method of forming a coating layer using electron beam evaporation.

The coating layer formed by the electron beam evaporation method has relatively superior purity of a coating layer compared to a coating layer formed by the plasma spraying method and thus has excellent plasma resistance and sufficiently low surface roughness. However, since the coating layer formed by the electron beam evaporation method also has a columnar structure and has a large number of pores therein, it can be easily destroyed in a high density plasma etching process, and thus, there are problems such as poor durability and a short lifespan.

Meanwhile, comparing between etching rates of $YF_3$ and $Y_2O_3$ coating films used as plasma resistant members in the plasma environment of the semiconductor manufacturing process, a chemical etching rate and a particle generating rate, which are related to an amount of particle generation, of yttrium fluoride ($YF_3$) or yttrium fluoride (Yttrium oxyfluoride; YOF) are lower than those of $Y_2O_3$.

As such, since YOF has a low particle generation rate as well as excellent plasma resistance, it has recently attracted attention as a plasma resistant coating material.

In addition, the various plasma resistant environments of semiconductor manufacturing facilities use various RF or DC energy beams, various RF frequency ranges, and various process gases and have various plasma resistant chamber structures. Since it is realistically impossible to expect plasma resistant members composed of a single optimized material in these various plasma resistant environments, it is required to develop a technology capable of easily forming a plasma resistant coating layer with a specialized composition, which is suitable for each plasma resistant environment.

PRIOR ART DOCUMENT

Patent Document (Patent Document 0001) Republic of Korea Patent Registration 10-1183021 (Oct. 28, 2011)

DETAILED DESCRIPTION OF THE INVENTION

Technical Problems

Accordingly, an object of the present invention is to solve the problems described above and to provide a method of forming a YOF coating layer of which a composition can be controlled, which allows manufacturing the YOF coating layer with various atomic ratios, by depositing a YOF coating layer on a substrate, which is formed by reaction of $YF_3$ particles evaporated in an electron beam source and oxygen radicals generated in a high-density RF energy beam source, and controlling an ion current density of the RF energy beam source to adjust an amount of fluorine substitution by oxygen.

In addition, an object of the present invention is to provide a method of forming a YOF coating layer of which a composition can be controlled, which allows minimizing physical etching by physical sputtering, minimizing micropores inside the coating layer to minimize a contact area with chemical etching gas, and minimizing chemical etching and generation of particles, by depositing a dense coating layer with no micropores therein using high energy ion bombardment by the RF energy beam source.

In addition, an object of the present invention is to provide a method of forming a YOF coating layer of which a composition can be controlled, which allows further increasing a fluorine substitution rate by oxygen, by evaporating $Y_2O_3$ along with $YF_3$ and increasing contribution of oxygen, and which allows easily forming YOF deposition particles having an atomic ratio that cannot be formed in a general environment, by controlling evaporation rate of $Y_2O_3$ to control an amount of fluorine substitution by oxygen.

SUMMARY OF THE INVENTION

Accordingly, the object of the present invention is achieved by a method of forming a coating layer of which a composition can be controlled, the method comprising steps of: preparing a substrate by placing the substrate in a substrate fixing device inside a process chamber; evaporating a deposition material to generate $YF_3$ or YOF particles in a gas phase by irradiating an electron beam on a $YF_3$ deposition material provided in a solid form in an electron beam source; generating radical particles having activation energy by injecting a process gas containing oxygen for forming radicals into a RF energy beam source; irradiating an RF energy beam including oxygen radical particles generated in the RF energy beam source, toward the substrate; controlling a composition of a thin film by generating YOF deposition particles having a modified atomic ratio by adjusting an amount of fluorine substitution by oxygen as the $YF_3$ or YOF particles and the oxygen radical particles react in an ion atmosphere formed between the RF energy beam source and the substrate, and depositing the YOF deposition particles on the substrate by being assisted by the RF energy beam.

Here, it is desired to further comprise a step of setting a process variable of the RF energy beam source prior to the step of irradiating an RF energy beam.

In addition, in the step of setting the process variable, it is desired to adjust a property of the coating layer by controlling an ion current density ($\mu A/cm^2$) irradiated into the substrate, which is a process variable of the RF energy beam source.

In addition, it is desired that the ion current density is set to 50 to 400 $\mu A/cm^2$.

In addition, in the step of controlling the composition of the thin film, it is desired to generate the YOF deposition particles having a modified atomic ratio, by controlling an amount of fluorine substitution by oxygen according to the ion current density set in the step of setting the process variable.

In addition, after the step of depositing the thin film, it is desired to further perform a step of densifying the thin film in which the YOF deposition particles deposited on the substrate form a high density densified film with no micropores by ion bombardment of the RF energy beam.

In addition, after the step of irradiating an RF energy beam, it is desired to further comprise a step of irradiating a deposition material in which $YF_3$ deposition particles in a gas phase are irradiated toward the substrate by opening a shutter of the electron beam source.

In addition, in the step of controlling the composition of the thin film, it is desired to form the YOF deposition particles having a modified atomic ratio through a reaction equation of $YF_3+O_2=YO_{(1\pm x)}F_{(1\pm y)}$ (x=0~0.8, y=0~1.8) or $YOF+O_2=YO_{(1\pm x)}F_{(1\pm y)}$ (x=0~0.8, y=0~1.8).

In addition, in the step of evaporating the deposition material, it is desired to additionally generate $Y_2O_3$ particles in a gas phase by irradiating an electron beam on a $Y_2O_3$ deposition material provided in a solid form in another electron beam source.

In addition, in the step of evaporating the deposition material, it is desired to relatively adjust an evaporation rate of $Y_2O_3$ particles compared to an evaporation rate of $YF_3$ or YOF by controlling an electron beam current of the electron beam source.

In addition, in the step of controlling the composition of the thin film, it is desired to form the YOF deposition particles having a modified atomic ratio through a reaction equation of $Y_2O_3+YF_3+O_2=YO_{(1\pm x)}F_{(1\pm y)}$(x=0~0.8, y=0~0.8) or $Y_2O_3+YOF+O_2=YO_{1\pm x)}F_{(1\pm y)}$ (x=0~0.8, y=0~0.8).

TECHNICAL EFFECTS OF THE INVENTION

The present invention provides a method of forming a YOF coating layer of which a composition can be controlled, which allows manufacturing the YOF coating layer with various atomic ratios, by depositing a YOF coating layer on a substrate, which is formed by reaction of $YF_3$ particles vaporized in an electron beam source and oxygen radicals generated in a high-density RF energy beam source, and controlling an ion current density of the RF energy beam source to control an amount of fluorine substitution by oxygen.

In addition, the present invention provides a method of forming a YOF coating layer of which a composition can be controlled, which allows minimizing physical etching by physical sputtering, minimizing micropores inside the coating layer to minimize a contact area with chemical etching gas, and minimizing chemical etching and generation of particles, by depositing a dense coating layer with no micropores therein using high energy ion bombardment by the RF energy beam source.

In addition, the present invention provides a method of forming a YOF coating layer of which a composition can be controlled, which allows further increasing a fluorine substitution rate by oxygen, by evaporating $Y_2O_3$ along with $YF_3$ and increasing contribution of oxygen, and which allows easily forming YOF deposited particles having an atomic ratio that cannot be formed in a general environment, by controlling evaporation rate of $Y_2O_3$ to control an amount of fluorine substitution by oxygen.

DETAILED DESCRIPTION

In various embodiments, components having the same configuration will be representatively described in a first embodiment group using the same reference number, and in other embodiments, configurations different from those in the first embodiment group will be described.

Hereinafter, the method of forming a coating layer of which a composition can be controlled according to the first embodiment group of the present invention will be described in detail in conjunction with the accompanying drawings.

Figure 1:
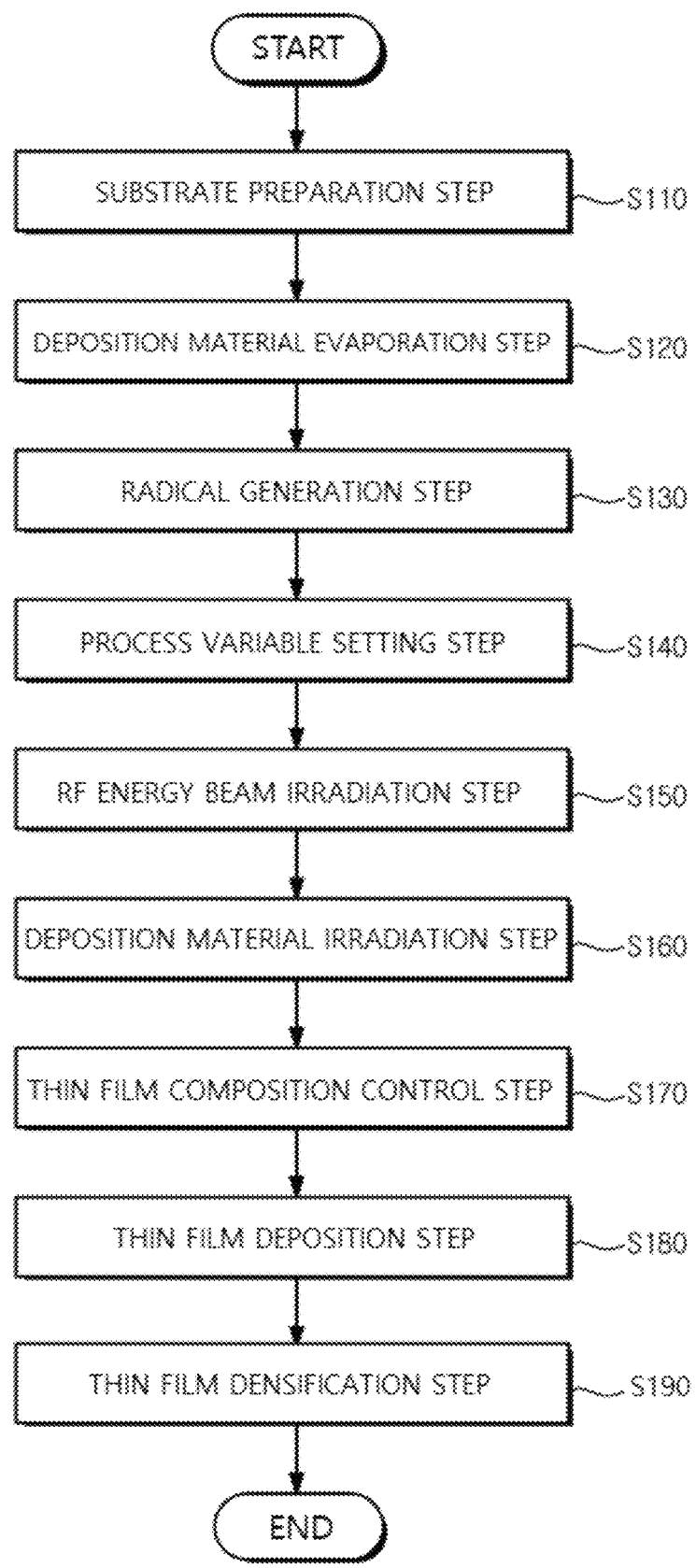
FIG. 1 is a process flowchart of a method of forming a coating layer of which a composition can be controlled according to the present invention.
Figure 2:
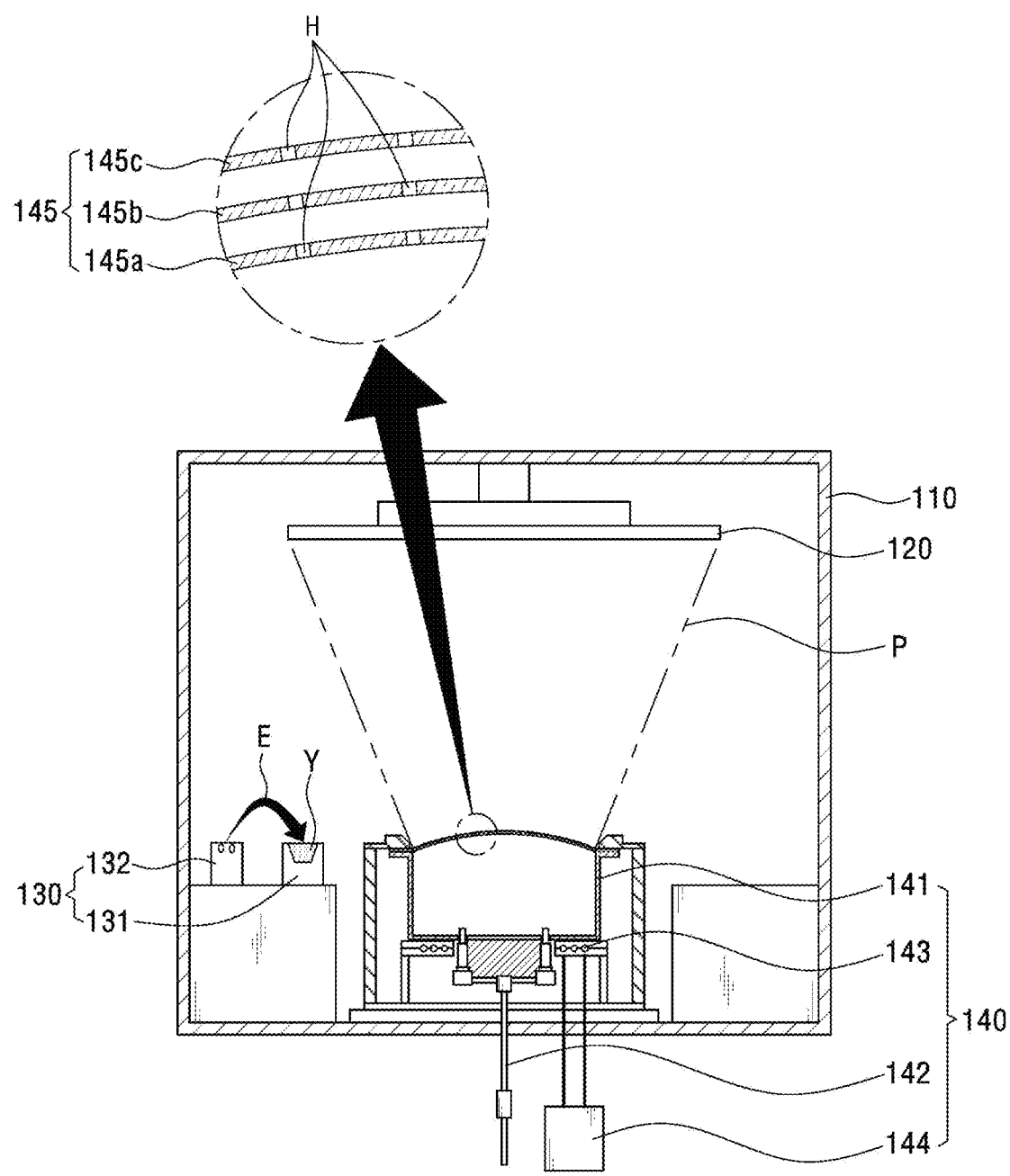
FIG. 2 is a schematic configuration diagram illustrating a deposition equipment used in the method of forming a coating layer of which a composition can be controlled according to the present invention.
Figure 3:
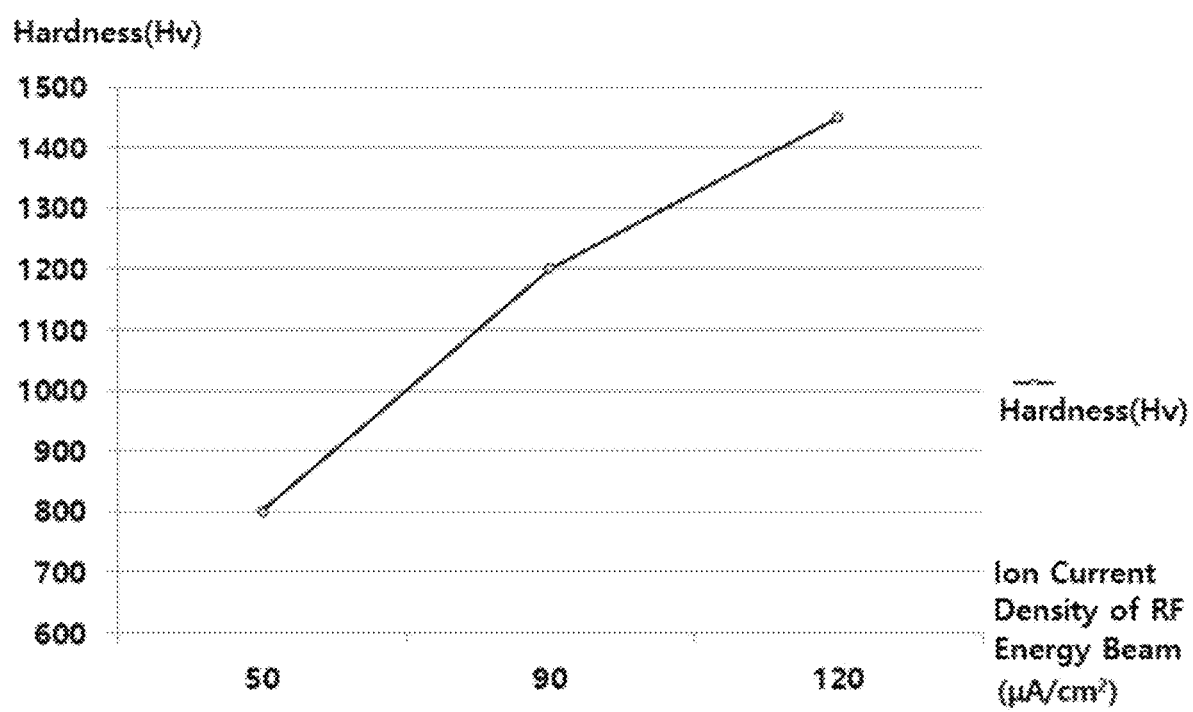
FIG. 3 is a graph illustrating a relationship between ion current density of a RF energy beam and hardness of a coating layer according to the present invention.
Figure 4:
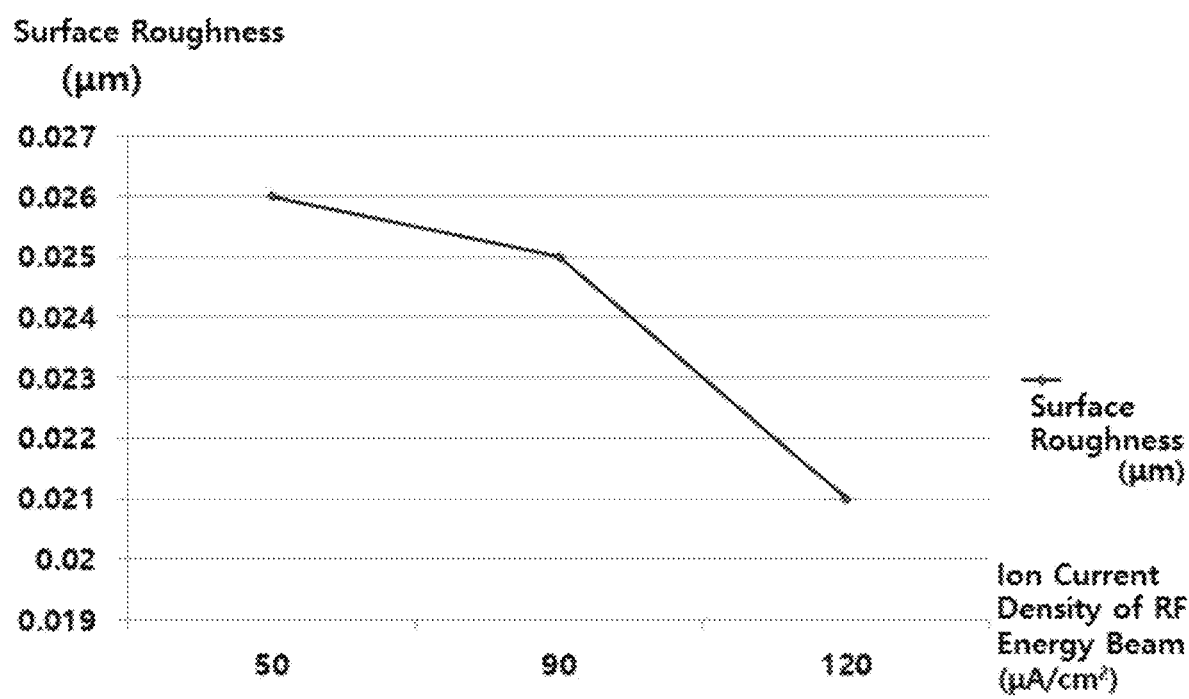
FIG. 4 is a graph illustrating a relationship between ion current density of the RF energy beam and surface roughness of a coating layer according to the present invention.
Figure 5:
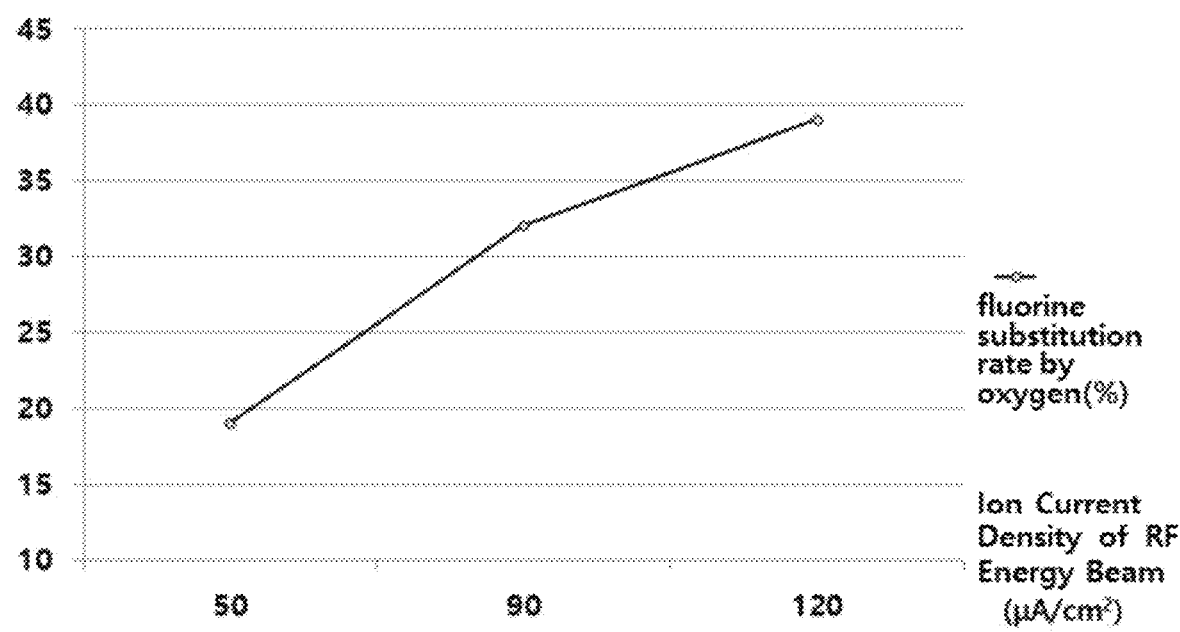
FIG. 5 is a graph illustrating a relationship between ion current density of the RF energy beam and fluorine substitution rate by oxygen according to the present invention.

FIG. 1 is a process flowchart of a method of forming a coating layer of which a composition can be controlled according to the present invention. FIG. 2 is a schematic configuration diagram illustrating a deposition equipment used in the method of forming a coating layer of which a composition can be controlled according to the present invention. FIG. 3 is a graph illustrating a relationship between ion current density of a RF energy beam and surface roughness of a coating layer according to the present invention. FIG. 4 is a graph illustrating a relationship between ion current density of the RF energy beam and surface roughness of a coating layer according to the present invention. FIG. 5 is a graph illustrating a relationship between ion current density of the RF energy beam and fluorine substitution rate by oxygen according to the present invention.

The method of forming a coating layer of which a composition can be controlled, of the present invention is to form a YOF coating layer having plasma resistance on a surface of a substrate 120 and comprises: a substrate preparation step S110, a deposition material evaporation step S120, a radical generation step S130, a process variable setting step S140, an RF energy beam irradiation step S150, a deposition material irradiation step S160, a thin film composition control step S170, a thin film deposition step S180, and a thin film densification step S190.

In the substrate preparation step S110, the substrate 120 is disposed on an upper portion of an inside of a process chamber 110.

In the deposition material evaporation step S120, $YF_3$ (Yttrium fluoride) deposition material provided in a solid form and accommodated in a crucible 131 is evaporated to provide $YF_3$ particles in a gas phase, by using an electron gun of an electron beam source 130 disposed inside the process chamber 110.

In the radical generating step S130, radical particles having high activation energy are generated using the RF energy beam source 140 disposed inside the process chamber 110. A process gas containing oxygen is supplied to a plasma generation space of the RF energy beam source 140 using a gas supply unit 142, and then RF power is applied to a RF antenna 143 through a RF power supply unit 144. By allowing a high frequency to be applied to the inside of a plasma chamber 141, oxygen is dissociated into radicals.

Meanwhile, in the radical generating step S130, oxygen and argon radicals having high activation energy can be generated by adding argon to the process gas according to a desired property of a YOF coating layer. When argon is additionally supplied, since atomic weight of argon is higher and heavier than oxygen, argon may be helpful to increase density and surface roughness of the YOF coating layer in the thin film densification step S190.

In the process variable setting step S140, by controlling the RF power applied to the RF antenna 143 through the RF power supply unit 144, an ion current density ($\mu A/cm^2$) and ion acceleration energy (eV) can be controlled.

That is, Since hardness (Hv) and surface roughness (μm) of the YOF coating layer are determined by the ion current density ($\mu A/cm^2$) and ion acceleration energy (eV) of an energy beam P, and the ion current density and the ion acceleration energy of the energy beam P are determined by characteristics of the RF power applied to the RF antenna 143 and the characteristics of a DC power applied to a DC electrode, properties of the YOF coating layer can be adjusted by controlling the RF power of the RF power supply 144 and the DC power of the DC power supply in the process variable setting step S140 according to a purpose or characteristic of the substrate 120. In this case, the ion current density incident on the substrate 120 may be set to 50 to 400 $\mu A/cm^2$, and the ion acceleration energy (eV) may be set to 600 to 2,000 eV.

Specifically, when the ion current density is less than $\mu A/cm^2$, densification effect of the YOF coating layer is significantly lowered and forms a columnar crystal structure, and thus, hardness and surface roughness of the YOF coating layer are poor. When the ion current density exceeds 400 $\mu A/cm^2$, as the densification of the YOF coating layer is made more than necessary, a crack occurs in the YOF coating layer, or adhesion between the YOF coating layer and the substrate 120 is lowered, thereby causing problems such as peeling of the YOF coating layer.

Similarly, when the ion acceleration energy is less than 600 eV, the densification effect of the YOF coating layer is significantly lowered and forms a columnar crystal structure. When the ion acceleration energy exceeds 2,000 eV, the hardness of the YOF coating layer becomes higher than necessary, thereby causing the YOF coating layer to be easily broken or peeled off the substrate 120.

In the RF energy beam irradiation step S150, voltage characteristics applied to a grid electrode 145 of the RF energy beam source 140 is controlled, and through the radical generating step S130, radical particles dissociated in the plasma generating space may be emitted toward the substrate 120.

When a positive voltage is applied to a first electrode 145a of the grid electrode 145, a negative voltage is applied to a second electrode 145b, and a third electrode 145c is grounded, as a potential difference for accelerating ions is generated between the first electrode 145a and the second electrode 145b, and radical particles and ions in the plasma generating space may be emitted in a beam form toward the substrate 120. In this case, a diameter of the RF energy beam P may be adjusted by controlling a potential difference between the second electrode 145b and the third electrode 145c.

That is, the grid electrode 145 disposed in an opening of the plasma chamber 141 of the RF energy beam source 140 accelerates ions included in the plasma in a process of emitting the ions through the through hole H of the grid electrode 145, and the ions may be provided toward the substrate 120 with 600 to 2,000 eV. Accordingly, since deposition particles are deposited on a surface of the substrate 120 by being assisted by the RF energy beam P having relatively higher energy than an electron beam or plasma beam, deposition density of the YOF coating layer can be further improved.

In the deposition material irradiation step S160, by opening a shutter of the electron beam source 130, evaporated $YF_3$ particles may be emitted to be provided toward the substrate 120. The deposition material irradiation step S160 is performed in a state in which the RF energy beam is irradiated toward the substrate 120 through the RF energy beam irradiation step S150.

In the thin film composition control step S170, as oxygen radicals having strong chemical activation energy and kinetic energy react with $YF_3$ particles to replace fluorine, YOF deposition particles can be formed through reaction equation of $YF_3 + O_2 = YO_{(1\pm x)}F_{(1\pm y)}$ (x=0~0.8, y=0~1.8).

In particular, since this reaction is performed in an ionic atmosphere with a high activation state, YOF deposition particles, which are difficult to be formed in a general environment, can be easily synthesized with various atomic ratios. Specifically, the atomic ratio of the YOF deposition particles can be adjusted by controlling an amount of fluorine substitution by oxygen according to the ion current density set in the process variable setting step S140. Accordingly, YOF deposited particles having a desired atomic ratio within the composition range as shown in Table 1 can be easily synthesized.

TABLE 1

|  |  | Yttrium | Oxygen | Fluoride |
|---|---|---|---|---|
| Atomic % | Min | 24% | 9% | 39% |
| Chemical formula |  |  | 0.32 | 1.42 |
| Atomic % | Max | 37% | 28% | 64% |
| Chemical formula |  |  | 0.96 | 2.65 |
| Stoichiometric (Atomic %) |  | 33.33 | 33.33 | 33.33 |

In the present embodiment, although it has been described as an example of evaporating $YF_3$ as the deposition material Y in the deposition material evaporation step S120, YOF instead of $YF_3$ may be evaporated, and in case of evaporating YOF, the reaction equation may be $YOF+O_2 = YO_{(1\pm x)}F_{(1\pm y)}$ (x=0~0.8, y=0~1.8). In this way, even when YOF is provided instead of $YF_3$ as the deposition material Y, YOF coating layers having various atomic ratios as shown in the above reaction equation can be formed. Since this reaction process is similar to the reaction of $YF_3+O_2$ described above, detailed description thereof will be omitted.

Hereinafter, the present invention will be described in more detail through embodiments. However, these embodiments are for illustrative purposes only, and the scope of the present invention is not limited to these embodiments.

TABLE 2

| Embodiment | Ion electric current density (μA/cm²) | Ion Acceleration energy (eV) | Process gas | Deposition material | Atomic ratio (Atomic %) | | | | | | Total atomic ratio (%) | Fluorine substitution rate by oxygen (%) | Chemical Formula | Physical property | | Plasma source |
|---|---|---|---|---|---|---|---|---|---|---|---|---|---|---|---|---|
|  |  |  |  |  | Oxygen (%) | | Fluoride (%) | | Yttrium (%) | |  |  |  | Hardness (Hv) | Surface roughness (μm) | |
| Embodiment 1 | >120 | >1000 | $O_2$, Ar | $YF_3$ | 28.2 | 0.96 | 42.4 | 1.44 | 29.4 | | 100 | 40% | $YO_{0.96}F_{1.44}$ | 1,520 | 0.016 | RF energy beam source |
| Embodiment 2 | >120 | >1000 | $O_2$ | $YF_3$ | 26.7 | 0.83 | 41.1 | 1.28 | 32.2 | | 100 | 39% | $YO_{0.83}F_{1.28}$ | 1,450 | 0.021 | |
| Embodiment 3 | >90 | >1000 | $O_2$ | $YF_3$ | 22.6 | 0.78 | 48.3 | 1.66 | 29.1 | | 100 | 32% | $YO_{0.78}F_{1.66}$ | 1,200 | 0.025 | |
| Embodiment 4 | >50 | >1000 | $O_2$ | $YF_3$ | 14 | 0.51 | 58.3 | 2.10 | 27.7 | | 100 | 19% | $YO_{0.51}F_{2.1}$ | 800 | 0.026 | |
| Comparative example 1 | >100 | >150 | $O_2$ | $YF_3$ | 4.4 | 0.15 | 66.5 | 2.29 | 29.1 | | 100 | 6% | $YO_{0.15}F_{2.29}$ | 320 | 0.21 | DC end hall source |

In the thin film deposition step S180, the YOF deposition particles formed in the thin film composition control step S170 are assisted by the RF energy beam P having high energy and are deposited on the surface of the substrate 120 to form the YOF coating layer. In the thin film densification step S190, as the YOF coating layer deposited on the surface of the substrate 120 through the thin film deposition step S180 is under ion bombardment by the energy beam P having high acceleration energy, the structure becomes densified and forms a high-density film with excellent quality, and thus, the hardness and surface roughness of the YOF coating layer can be improved.

Meanwhile, in the thin film densification step S190, the density of the YOF coating layer is further increased, and the physical properties of the YOF coating layer can be further improved, by rapidly increasing a surface temperature of the YOF coating layer and then cooling it rapidly, like Rapid Thermal Process (RTP) used in a semiconductor process.

Embodiments 1 to 4

According to the Embodiment 1, a polished sample is mounted on a substrate fixing unit provided inside the process chamber 110 of the deposition equipment, and power is applied to the electron beam source 130 and generates an electron beam E by increasing current up to 100 mA. The $YF_3$ deposition material is melted by the electron beam E current. The rotation speed of the substrate fixing unit is maintained at about 20 rpm. A process gas for forming radicals of oxygen and argon is injected into the RF energy beam source 140, and an RF energy beam is formed. The RF power is controlled so that the current density of the RF energy beam could be maintained at 120 μA/cm² or more, and the ion acceleration energy is maintained at 1,000 eV or more. A shutter of the RF energy beam source 140 is opened to irradiate the RF energy beam P to the substrate 120, and then a shutter of the electron beam source 130 is opened to provide $YF_3$ material toward the surface of the substrate 120.

In a process of scattering YF$_3$ particles to the substrate 120 to reach the substrate 120, some fluorine atoms of YF$_3$ are replaced by oxygen through chemical and physical interactions with oxygen and argon radicals included in the RF energy beam P, and through the process, the YOF deposition material is deposited on the substrate 120. In this process, the growth of the YOF thin film is compacted by strong ion bombardment, and the YOF thin film is formed to have a dense film quality.

In addition, in the Embodiment 2, the ion current density is 120 µA/cm 2, the ion acceleration energy is 1,000 eV, and oxygen as the process gas is injected. In the Embodiment 3, the ion current density is 90 µA/cm 2, the ion acceleration energy is 1,000 eV, and oxygen as the process gas is injected. In the Embodiment 4, the ion current density was 50 µA/cm 2, the ion acceleration energy was 1,000 eV, and oxygen as the process gas is injected.

According to coating layers formed by the Embodiments 1 to 4 as described above, in the Embodiment 1, a coating layer with an atomic ratio of YO$_{0.96}$F$_{1.44}$, which has oxygen of 28.2%, fluorine of 42.4%, and yttrium of 29.4%, is formed. Hardness of the coating layer is 1,520 Hv, and surface roughness is 0.016 µm. In the Embodiment 2, a coating layer with an atomic ratio of YO$_{0.83}$F$_{1.28}$, which has oxygen of 26.7%, fluorine of 41.1%, and yttrium of 32.2%, is formed. Hardness of the coating layer is 1,450 Hv, and surface roughness is 0.021 µm. In the Embodiment 3, a coating layer with an atomic ratio of YO$_{0.78}$F$_{1.66}$, which has oxygen of 22.6%, fluorine of 48.3%, and yttrium of 29.1%, is formed. Hardness of the coating layer is 1,200 Hv, and surface roughness is 0.025 µm. In the Embodiment 4, a coating layer with an atomic ratio of YO$_{0.51}$F$_{2.1}$, which has oxygen of 14%, fluorine of 58.3%, and yttrium of 27.7%, is formed. Hardness of the coating layer is 800 Hv, and surface roughness is 0.026 µm.

That is, the substitution rate of fluorine by oxygen of the coating layer formed by the Embodiments 1 to 4 has a tendency to be linearly proportional to the ion current density, and the hardness and surface roughness also has a tendency to be linearly proportional to the ion current density.

Comparative Example 1

According to Comparative Example 1, a polished sample is mounted on the substrate fixing unit provided inside the process chamber 110 of the deposition equipment, and power is applied to the electron beam source 130 and generates an electron beam E by increasing the current up to 100 mA. The YF$_3$ deposition material is melted by the electron beam E current. The rotation speed of the substrate fixing unit is maintained at about 20 rpm. A process gas for forming radicals of oxygen and argon is injected into a DC End Hall Source 140, and a radical beam is formed. An anode DC voltage is adjusted so that the current density of radical ions could be maintained at 100 µA/cm$^2$ or more, and the ion acceleration energy is maintained at 150 eV or more. The shutter of the DC energy beam source is opened to irradiate the DC energy beam to the substrate 120, and then the shutter of the electron beam source 130 is opened to provide YF$_3$ material toward the surface of the substrate 120. In a process of scattering YF$_3$ particles to the substrate 120 to reach the substrate 120, some fluorine atoms of YF$_3$ are replaced by oxygen through chemical and physical interactions with oxygen and argon radicals included in the DC energy beam, and through the process, the YOF deposition material is deposited on the substrate 120.

According to the comparative example 1, the coating layer with an atomic ratio of YO$_{0.15}$F$_{2.29}$, which has oxygen of 4.4%, fluorine of 66.5%, and yttrium of 29.1%, is formed. Hardness of the coating layer is 320 Hv, and surface roughness is 0.21 µm. As such, since the YOF coating layer formed in Comparative Example 1 is deposited through support of the DC energy beam having relatively low energy compared to the RF energy beam, the YOF coating layer goes through a relatively low densification process compared to the Embodiments 1 to 4 in which the RF energy beam is provided, and accordingly, it shows lower hardness and higher surface roughness compared to Embodiments 1 to 4.

Hereinafter, a method of forming a coating layer of which a composition can be controlled according to a second embodiment group of the present invention will be described in detail with reference to the accompanying drawings.

Figure 8:
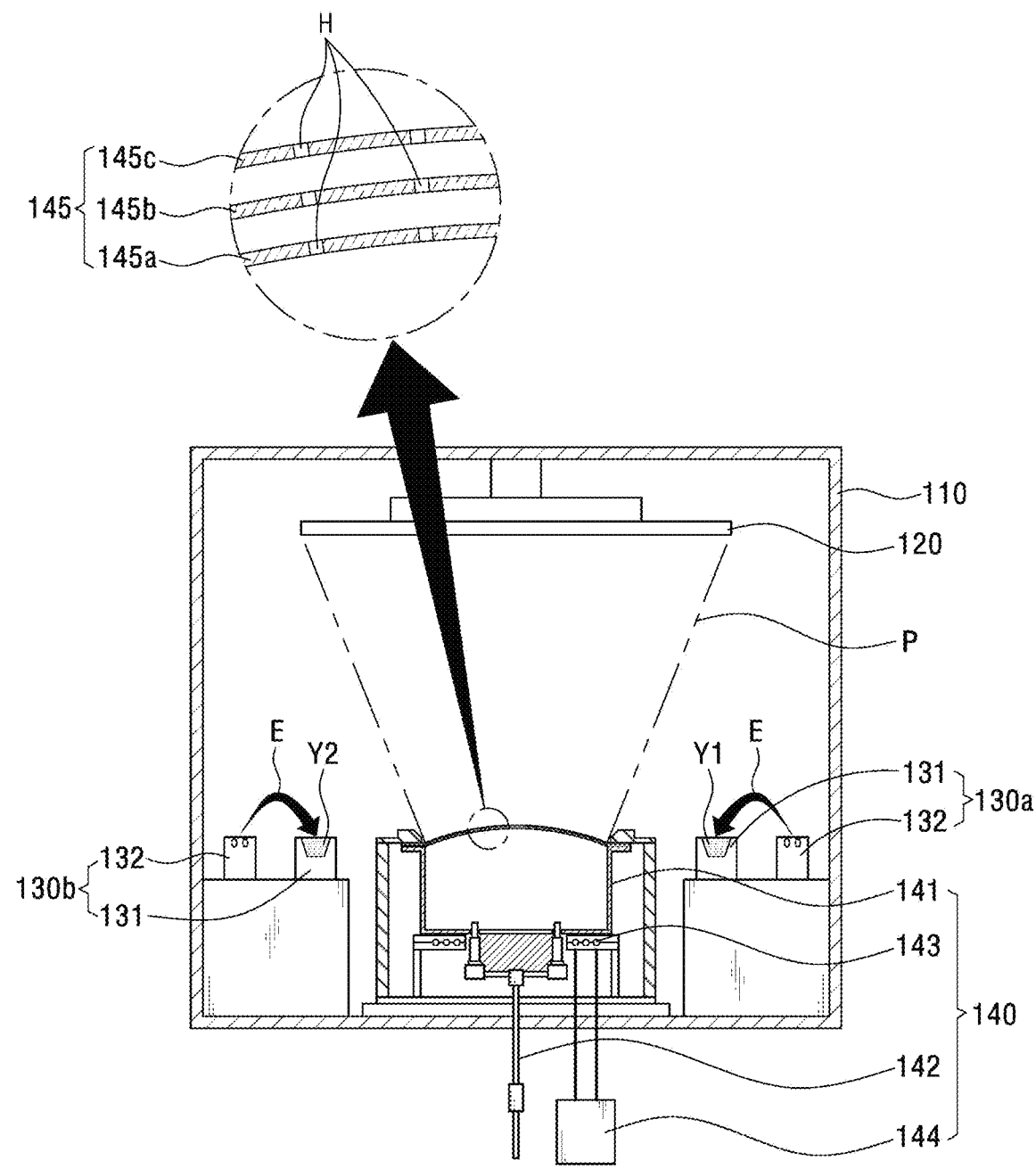
FIG. 8 is a schematic configuration diagram illustrating a deposition equipment used in a method of forming a coating layer of which a composition can be controlled according to another embodiment of the present invention.

FIG. 8 is a schematic configuration diagram illustrating a deposition equipment used in the method of forming a coating layer of which a composition can be controlled according to the second embodiment group of the present invention.

As shown in FIGS. 8 and 9, the method of forming a coating layer of which a composition can be controlled according to the second embodiment group of the present invention differs from the first embodiment group of the embodiments 1 to 4 in that in the deposition material evaporation step S120, Y$_2$O$_3$ particles and YF$_3$ particles in gas phase are respectively provided by evaporating Y$_2$O$_3$ as a first deposition material Y1 and evaporating YF$_3$ as a second deposition material Y2. Since the remaining steps except for the deposition material evaporation step S120 are the same as those of the first embodiment group, a detailed description of the same steps will be omitted.

Specifically, in the deposition material evaporation step S120, Y$_2$O$_3$ particles in a gas phase is provided by vaporizing, or evaporating, Y$_2$O$_3$ in a first electron beam source 130*a* disposed inside the process chamber 110, and YF$_3$ particles in a gas phase is provided by vaporizing, or evaporating, YF$_3$ in a second electron beam source 130*b* disposed separately from the first electron beam source 130*a* inside the process chamber 110. At this time, the first electron beam source 130*a* is configured to relatively adjust an evaporation rate of Y$_2$O$_3$ particles compared to an evaporation rate of YF$_3$ by controlling an electron beam current, and the second electron beam source 130*b* is also configured to relatively adjust an evaporation rate of YF$_3$ by controlling an electron beam current.

Accordingly, in the thin film composition control step S170, as oxygen radicals having strong chemical activation energy and kinetic energy react with YF$_3$ particles to replace fluorine, and the fluorine substitution rate is further improved by increasing oxygen contribution by the Y$_2$O$_3$ particles, YOF deposition particles with a modified atomic ratio are formed through the reaction equation of Y$_2$O$_3$+YF$_3$+O$_2$=YO$_{(1\pm x)}$F$_{(1\pm y)}$ (x=0~0.8, y=0~0.8).

This reaction is occurred in an ionization atmosphere with a high activation state, and the fluorine substitution rate in the thin film composition control step S170 can be adjusted by controlling the evaporation rate of Y$_2$O$_3$, so YOF deposition material having a component ratio difficult to form in a general environment can be easily formed.

TABLE 3

| Embodiment | Ion electric current density ($\mu A/cm^2$) | Process gas | Deposition material 1/ Evaporation rate (Arbitrary unit) | Deposition material 2/ Evaporation rate (Arbitrary unit) | Atomic ratio (Atomic %) | | | | | | Fluorine substitution rate by oxygen (%) | Chemical Formula |
|---|---|---|---|---|---|---|---|---|---|---|---|---|
| | | | | | Oxygen (%) | | Fluoride (%) | | Yttrium (%) | Total atomic ratio (%) | | |
| Embodiment 5 | >50 | $O_2$, Ar | $Y_2O_3$/2 | $YF_3$/10 | 30 | 1.00 | 40 | 1.33 | 30 | 100 | 43 | $YO_{1.00}F_{1.33}$ |
| Embodiment 6 | >50 | $O_2$, Ar | $Y_2O_3$/4 | $YF_3$/10 | 34 | 1.21 | 38 | 1.36 | 28 | 100 | 47 | $YO_{1.21}F_{1.36}$ |
| Embodiment 7 | >50 | $O_2$, Ar | $Y_2O_3$/8 | $YF_3$/10 | 36 | 1.24 | 35 | 1.21 | 29 | 100 | 51 | $YO_{1.24}F_{1.21}$ |
| Embodiment 8 | >50 | $O_2$, Ar | $Y_2O_3$/10 | $YF_3$/10 | 38 | 1.27 | 32 | 1.07 | 30 | 100 | 54 | $YO_{1.27}F_{1.07}$ |

Embodiments 5 to 8

According to the Embodiment 5, a polished sample is mounted on the substrate fixing unit provided inside the process chamber 110 of the deposition equipment, and power is applied to a first electron beam source 130a and generates an electron beam by increasing the current up to 300 mA. Accordingly, a first $YF_3$ deposition material is melted by the electron beam E current. In addition, power is applied to a second electron beam source 130b and generates an electron beam by increasing the current up to 100 mA. Accordingly, a second $YF_3$ deposition material is melted by the electron beam E current. The rotation speed of the substrate fixing unit is maintained at about 20 rpm. A process gas for forming radicals of oxygen and argon is injected into the RF energy beam source 140, and an RF energy beam is formed. The RF power is controlled so that the current density of the RF energy beam could be maintained at 50 $\mu A/cm^2$ or more, and the ion acceleration energy is maintained at 600 eV or more. The shutter of the RF energy beam source 140 is opened to irradiate the RF energy beam P to the substrate 120, and then the shutters of the first electron beam source 130a and the second electron beam source 130b are respectively opened to provide $Y_2O_3$ particles and $YF_3$ particles toward the surface of the substrate 120. In a process of scattering $Y_2O_3$ and $YF_3$ particles to the substrate 120 to reach the substrate 120, some fluorine atoms of $YF_3$ are replaced by oxygen through chemical and physical interactions with oxygen and argon radicals included in the RF energy beam P, and through the process, the YOF deposition material is deposited on the substrate 120. In this process, the growth of the YOF thin film is compacted by strong ion bombardment, and the YOF thin film is formed to have a dense film quality.

In addition, in the Embodiments 6, 7, and 8, the YOF thin film is deposited in a condition of allowing $Y_2O_3$ provided from the first electron beam source 130a to evaporate at different rates by setting the power of the first electron beam source 130a to 400 mA, 550 mA, and 700 mA, respectively. The remaining conditions are set to the same as in the Embodiment 5.

Meanwhile, in this Embodiment, although it is described as an example that the evaporation rate of the first deposition material Y1 is adjusted to 2, 4, 8, and 10 (Arbitrary Unit) by controlling the electron beam current of the first electron beam source 130a to 300 to 700 mA, and the evaporation rate of the second deposition material Y2 is maintained at 10 (Arbitrary Unit) by setting the electron beam current of the second electron beam source 130b to 100 mA, the setting value of the electron beam current may be changed according to a size of the substrate to be deposited or deposition environment. The set value of the electron beam current may be changed according to the size of the substrate to be deposited or the deposition environment.

According to the Embodiments 5 to 8 described above, in the Embodiment 5, the coating layer with an atomic ratio of $YO_{1.00}F_{1.33}$, which has oxygen of 30%, fluorine of 40%, and yttrium of 30%, is formed. In the Embodiment 6, the coating layer with an atomic ratio of $YO_{1.21}F_{1.36}$, which has oxygen of 34%, fluorine of 38%, and yttrium of 28%, is formed. In the Embodiment 7, the coating layer with an atomic ratio of $YO_{1.24}F_{1.21}$, which has oxygen of 36%, fluorine of 35%, and yttrium of 29%, is formed. In the Embodiment 8, the coating layer with an atomic ratio of $YO_{1.27}F_{1.07}$, which has oxygen of 38%, fluorine of 32%, and yttrium of 30%, is formed.

That is, the substitution rate of fluorine by oxygen of the coating layer formed in Embodiments 5 to 8 has a tendency to be linearly proportional to the evaporation rate of $Y_2O_3$.

Meanwhile, in the present embodiment, although it is described as an example of evaporating $YF_3$ as the second deposition material Y2 in the deposition material evaporation step S120, YOF instead of $YF_3$ may be evaporated, and in case of evaporating YOF, the reaction equation may be $Y_2O_3 + YOF + O_2 = YO_{(1 \pm x)}F_{(1 \pm y)}$ (x=0~0.8, y=0~0.8). As described above, even when YOF is provided instead of $YF_3$ as the second deposition material Y2, YOF coating layers having various atomic ratios as shown in the reaction equation mentioned above may be formed. Since this reaction process is similar to the reaction of $Y_2O_3 + YF_3 + O_2$ described above, a detailed description thereof will be omitted.

As described above, when the ion current density of the RF energy beam P irradiated to the substrate 120 increases during the deposition of the YOF coating layer, hardness of the YOF coating layer tends to increase as shown in FIG. 3. This is because, as the ion current density of the RF energy beam P increases, energy of ion bombardment in the growing YOF coating layer increases, thereby increasing density and hardness of the YOF coating layer.

In addition, as the ion current density of the RF energy beam P irradiated to the substrate 120 increases during the deposition of the YOF coating layer, surface roughness of the YOF coating layer tends to decrease as shown in FIG. 4 and to have a more uniform and flat surface. This is because, as the ion current density of the RF energy beam P increases, energy of ion bombardment in the growing YOF coating layer increases, thereby improving mobility of the deposition particles of the growing YOF coating layer and allowing the surface to be smoother to lower surface roughness.

In addition, as the ion current density of the RF energy beam P irradiated to the substrate 120 increases during the deposition of the YOF coating layer, the fluorine substitution rate by oxygen in the thin film tends to increase as shown in FIG. 5. This is because, as the ion current density of the RF energy beam P increases, the number of oxygen radicals with high activation energy capable of replacing fluorine increases, and thus, a possibility of fluorine substitution by oxygen increases, thereby increasing the fluorine substitution rate.

In addition, by evaporating $Y_2O_3$ along with $YF_3$ in the process chamber and increasing contribution of oxygen, the fluorine substitution rate by oxygen can be further increased. In this case, by increasing an evaporation rate of $Y_2O_3$, oxygen contribution is increased and a fluorine substitution rate by oxygen can be further increased. Accordingly, by controlling the evaporation rate of $Y_2O_3$ while providing $Y_2O_3$ along with $YF_3$, YOF deposition particles having an atomic ratio that cannot be formed in a general environment can be easily formed.

Figure 6A:
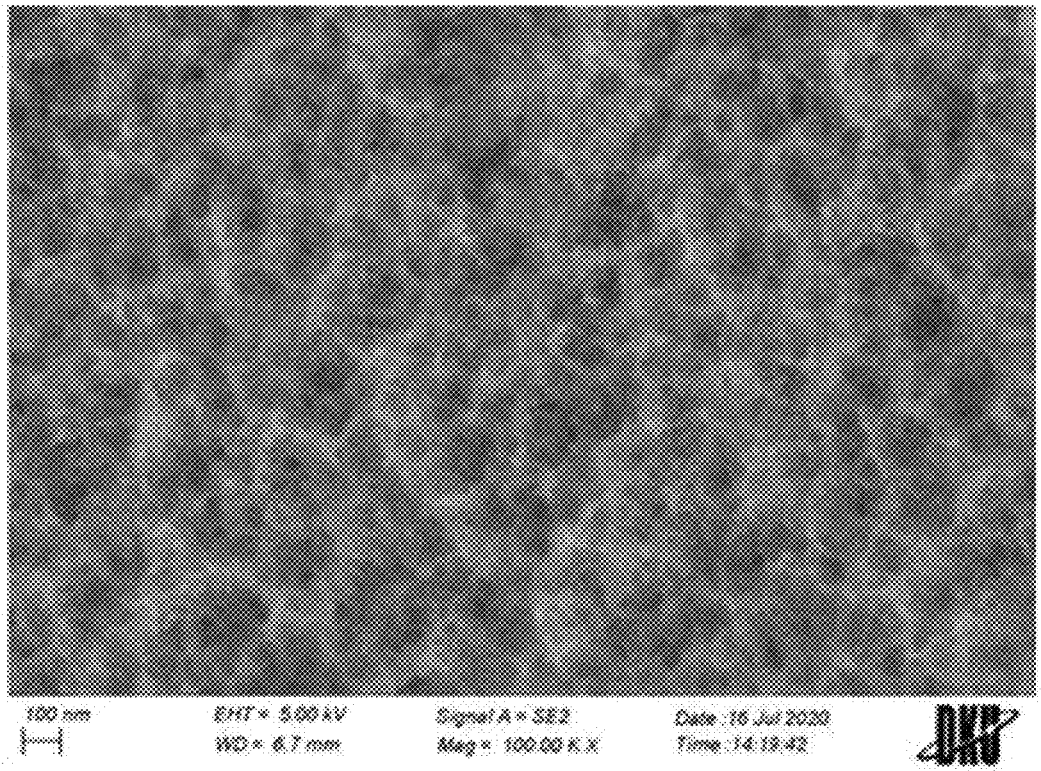
FIGS. 6A and B are SEM surface photographs of Embodiment 1 of the present invention and Comparative Example 1.
Figure 7A:
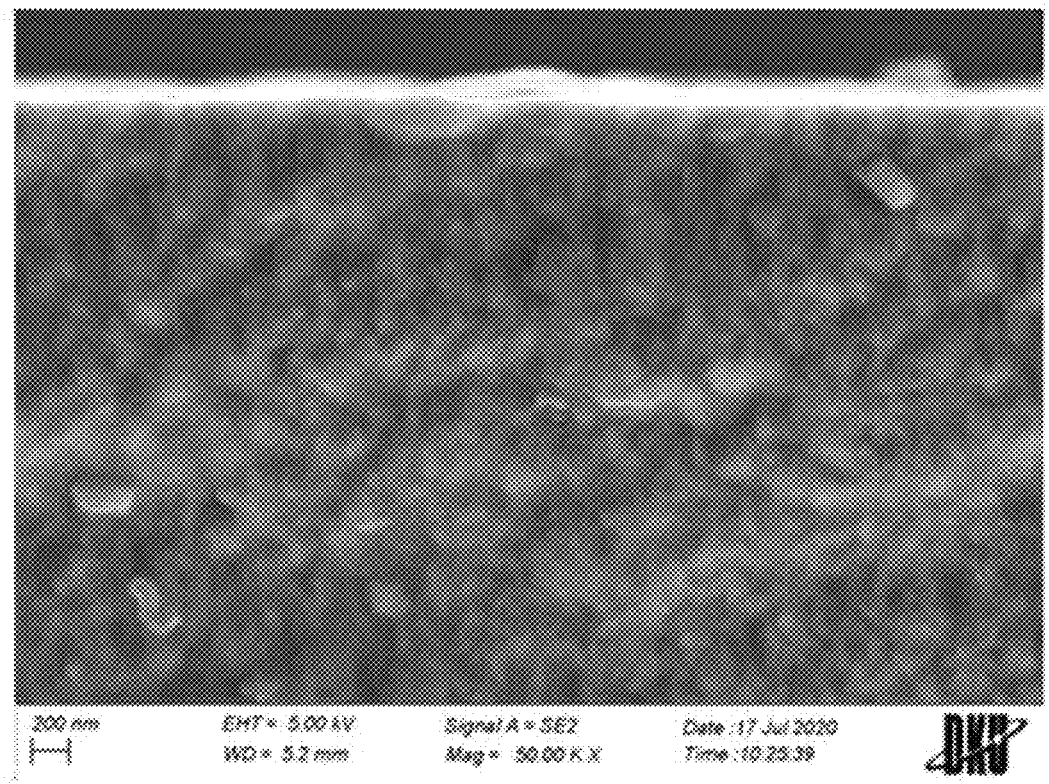
FIGS. 7A and 7B are SEM cross section photographs of the Embodiment 1 of the present invention and the Comparative Example 1.
Figure 7B:
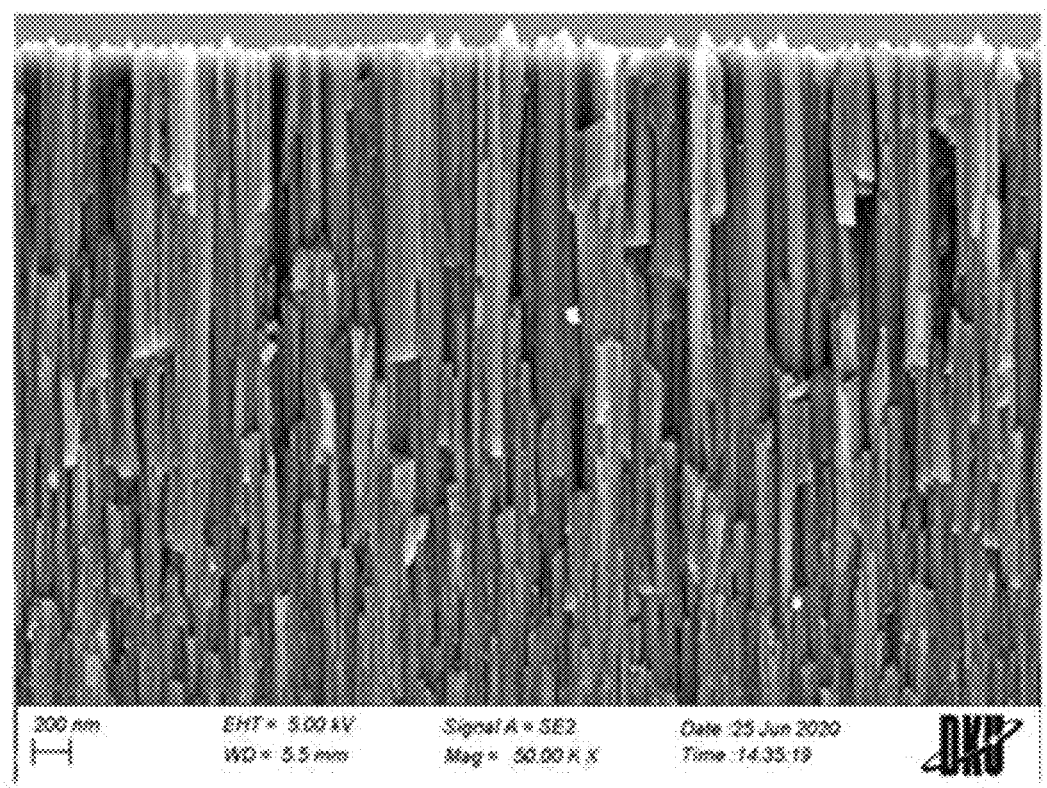

FIGS. 6A and B are SEM surface photographs of the Embodiment 1 of the present invention and Comparative Example 1. FIGS. 7A and 7B are SEM cross section photographs of the Embodiment 1 of the present invention and the Comparative Example 1.

Figure 6B:
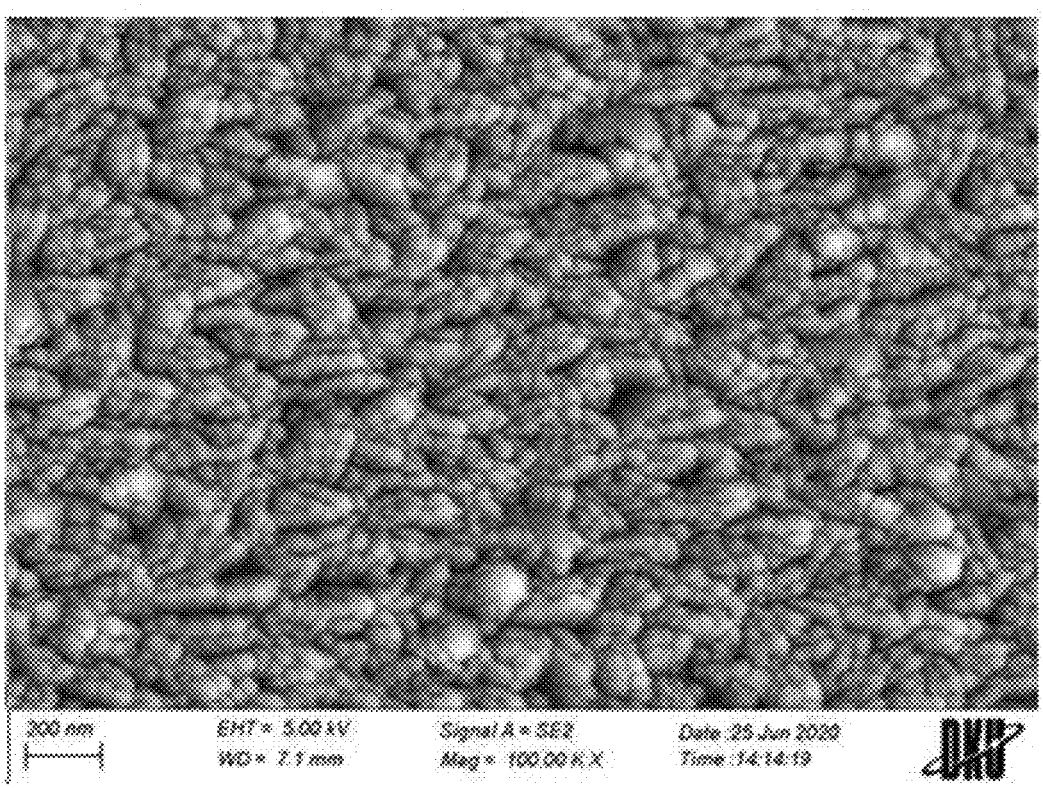

FIG. 6A is a Scanning Electron Microscope (SEM) photograph showing a surface of the YOF coating layer deposited in the Embodiment 1, and FIG. 6B is a SEM photograph showing a surface of the YOF coating layer deposited in the Comparative Example 1. As shown in FIGS. 6A and B are, in the case of the Embodiment 1 in which the ion current density of the RF energy beam irradiated to the substrate 120 during the deposition of the YOF coating layer is relatively high, the SEM surface photograph shows that a surface shape is smoother and has low surface roughness, whereas in the case of the Comparative Example 1, the SEM surface photograph shows that a surface shape of the coating layer has protrusions of columnar structures.

In addition, FIG. 7A is a SEM photograph showing a cross section of the YOF coating layer deposited in the Embodiment 1, and FIG. 7B is a SEM photograph showing a cross section of the YOF coating layer deposited in the Comparative Example 1. As shown in FIGS. 7A and 7B, in the case of the Embodiment 1 in which the ion current density of the RF energy beam irradiated to the substrate 120 during the deposition of the YOF coating layer is relatively high, the SEM cross section photograph shows that a shape of a cross section of the coating layer has a dense structure, whereas in the case of the Comparative Example 1, the SEM cross section photograph shows that a shape of a cross section of the coating layer has protrusions of columnar structures.

As describe above, the present invention can deposit a dense coating layer with no micropores therein using high energy ion bombardment by the RF energy beam source, thereby minimizing physical etching by physical sputtering, minimizing micropores inside the coating layer to minimize a contact area with chemical etching gas, and minimizing chemical etching and generation of particles.

The scope of the present invention is not limited to the embodiments described above but may be implemented in various forms of embodiments within the scope of the appended claims. In addition, it is considered to be within the scope of the claims of the present invention to the various extents that can be modified without departing from the gist of the present invention in the claims, by those of ordinary skill in the art to which the invention pertains.

What is claimed is:

1. A method of forming a coating layer of which a composition can be controlled, the method comprising steps of:
   preparing a substrate by placing the substrate in a substrate fixing device inside a process chamber;
   evaporating a deposition material to generate $YF_3$ or YOF particles in a gas phase by irradiating an electron beam on a $YF_3$ deposition material provided in a solid form in an electron beam source;
   generating radical particles having activation energy by injecting a process gas containing oxygen for forming radicals into a RF energy beam source;
   setting a process variable of the RF energy beam source;
   irradiating a RF energy beam including oxygen radial particles generated in the RF energy beam source, toward the substrate;
   controlling a composition of a thin film by generating YOF deposition particles having a modified atomic ratio by adjusting an amount of fluorine substitution by oxygen as the $YF_3$ or YOF particles and the oxygen radical particles react in an ion atmosphere formed between the RF energy beam source and the substrate;
   depositing the YOF deposition particles on the substrate by being assisted by the RF energy beam, and
   densifying the thin film in which the YOF deposition particles deposited on the substrate form a high density densified film with no micropores by ion bombardment of the RF energy beam,
   wherein the step of setting the process variable is to adjust hardness and surface roughness of the coating layer by controlling an ion current density ($\mu A/cm^2$) and ion acceleration energy (eV) of the RF energy beam generated from the RF energy beam source and irradiated toward the substrate.

2. The method of forming a coating layer of claim 1, wherein the ion current density is set to 50 to 400 $\mu A/cm^2$.

3. The method of forming a coating layer of claim 1, wherein the step of controlling the composition of the thin film is a step of generating the YOF deposition particles having a modified atomic ratio, by controlling an amount of fluorine substitution by oxygen according to the ion current density set in the step of setting the process variable.

4. The method of forming a coating layer of claim 1, further comprising a step of irradiating a deposition material in which $YF_3$ deposition particles in a gas phase are irradiated toward the substrate by opening a shutter of the electron beam source, after the step of irradiating the RF energy beam.

5. The method of forming a coating layer of claim 1, wherein the step of controlling the composition of the thin film is a step of forming the YOF deposition particles having a modified atomic ratio through a reaction equation of $YF_3+O_2=YO_{(1\pm x)}F_{(1\pm y)}$ (x=0~0.8, y=0~1.8) or $YOF+O_2=YO_{(1\pm x)}F_{(1\pm y)}$ (x=0~0.8, y=0~1.8).

6. The method of forming a coating layer of claim 1, wherein the step of evaporating the deposition material is a step of additionally generating $Y_2O_3$ particles in a gas phase by irradiating an electron beam on a $Y_2O_3$ deposition material provided in a solid form in another electron beam source.

7. The method of forming a coating layer of claim 6, wherein the step of evaporating the deposition material is a step of relatively adjusting an evaporation rate of $Y_2O_3$ particles compared to an evaporation rate of $YF_3$ or YOF by controlling an electron beam current of the electron beam source.

8. The method of forming a coating layer of claim 6, wherein the step of controlling the composition of the thin film is a step of forming the YOF deposition particles having a modified atomic ratio through a reaction equation of $Y_2O_3 + YF_3 + O_2 = YO_{(1\pm x)}F_{(1\pm y)}$ (x=0~0.8, y=0~0.8) or $Y_2O_3 + YOF + O_2 = YO_{(1\pm x)}F_{(1\pm y)}$ (x=0~0.8, y=0~0.8).

* * * * *